(12) United States Patent
Kub et al.

(10) Patent No.: US 10,158,009 B2
(45) Date of Patent: *Dec. 18, 2018

(54) METHOD OF MAKING A GRAPHENE BASE TRANSISTOR WITH REDUCED COLLECTOR AREA

(71) Applicant: The United States of America, as represented by the Secretary of the Navy, Washington, DC (US)

(72) Inventors: Francis J. Kub, Arnold, MD (US); Travis J. Anderson, Alexandria, VA (US); Andrew D. Koehler, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/408,813

(22) Filed: Jan. 18, 2017

(65) Prior Publication Data

US 2017/0125557 A1    May 4, 2017

Related U.S. Application Data

(62) Division of application No. 14/952,422, filed on Nov. 25, 2015, now Pat. No. 9,590,081, which is a division
(Continued)

(51) Int. Cl.
*H01L 29/16* (2006.01)
*H01L 29/737* (2006.01)
(Continued)

(52) U.S. Cl.
CPC ...... *H01L 29/7371* (2013.01); *H01L 29/0817* (2013.01); *H01L 29/0821* (2013.01); *H01L 29/1004* (2013.01); *H01L 29/165* (2013.01); *H01L 29/1606* (2013.01); *H01L 29/1608* (2013.01); *H01L 29/2003* (2013.01); *H01L 29/267* (2013.01); *H01L 29/66037* (2013.01); *H01L 29/66068* (2013.01); *H01L 29/66242* (2013.01); *H01L 29/66318* (2013.01); *H01L 29/66931* (2013.01); *H01L 29/66939* (2013.01); *H01L 29/66969* (2013.01); *H01L 29/732* (2013.01); *H01L 29/7606* (2013.01)

(58) Field of Classification Search
None
See application file for complete search history.

(56) References Cited

U.S. PATENT DOCUMENTS

| 9,590,081 B2* | 3/2017 | Kub | H01L 29/66242 |
|---|---|---|---|
| 2003/0122133 A1* | 7/2003 | Choi | B82Y 10/00 257/77 |
| 2012/0292596 A1* | 11/2012 | Dabrowski | H01L 29/0821 257/29 |

* cited by examiner

*Primary Examiner* — Whitney T Moore
*Assistant Examiner* — Herve Assouman
(74) *Attorney, Agent, or Firm* — US Naval Research Laboratory; Stephen T. Hunnius

(57) ABSTRACT

A method of making a graphene base transistor with reduced collector area comprising forming an electron injection region, forming an electron collection region, and forming a base region wherein the base region comprises one or more sheets of graphene and wherein the base region is intermediate the electron injection region and the electron collection region and forms electrical interfaces therewith.

3 Claims, 8 Drawing Sheets

Related U.S. Application Data of application No. 14/178,375, filed on Feb. 12, 2014, now Pat. No. 9,236,432.

(60) Provisional application No. 61/803,597, filed on Mar. 20, 2013.

(51) Int. Cl.
*H01L 29/66* (2006.01)
*H01L 29/267* (2006.01)
*H01L 29/76* (2006.01)
*H01L 29/165* (2006.01)
*H01L 29/732* (2006.01)
*H01L 29/08* (2006.01)
*H01L 29/20* (2006.01)
*H01L 29/10* (2006.01)

METHOD OF MAKING A GRAPHENE BASE TRANSISTOR WITH REDUCED COLLECTOR AREA

REFERENCE TO RELATED APPLICATION

This application is a non-provisional of, and claims priority to and the benefits of, U.S. Provisional Patent Application No. 61/803,597 filed on Mar. 20, 2013, and U.S. patent application Ser. No. 14/178,375 filed on Feb. 12, 2014, U.S. patent application Ser. No. 14/952,422 filed on Nov. 25, 2015, the entireties of each are hereby incorporated by reference.

BACKGROUND

This disclosure describes a semiconductor transistor device having a graphene base transistor with reduced collector area, and method for fabrication. The graphene base transistor with reduced collector area comprises an electron injection region (the first region), an electron collection region (the third region), and a base region (second region) with the base region consisting of one or more sheets of graphene known as the base graphene material layer region that is intermediate the first and third regions and forms electrical interfaces therewith. The first region comprises an emitter region, and the second region comprises a base region, with typically the emitter region electrically contacting the base region and forming the emitter/base interface. The base region is typically also in electrical contact with the third region material and forms the base/collector interface.

SUMMARY OF DISCLOSURE

Description

This disclosure describes a graphene base transistor with reduced collector area, and method for fabrication. The graphene base transistor with reduced collector area comprises an electron injection region (the first region), an electron collection region (the third region), and a base region (second region). The base region consists of one or more sheets of graphene, known as the base graphene material layer region, and is intermediate the first and third regions and forms electrical interfaces therewith.

The first region comprises an emitter region. The second region comprises a base region. Typically the emitter region electrically contacts the base region and forms the emitter/base interface. The base region is typically also in electrical contact with the third region material and forms the base/collector interface.

DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings.

DETAILED DESCRIPTION OF THE INVENTION

Figure 1:
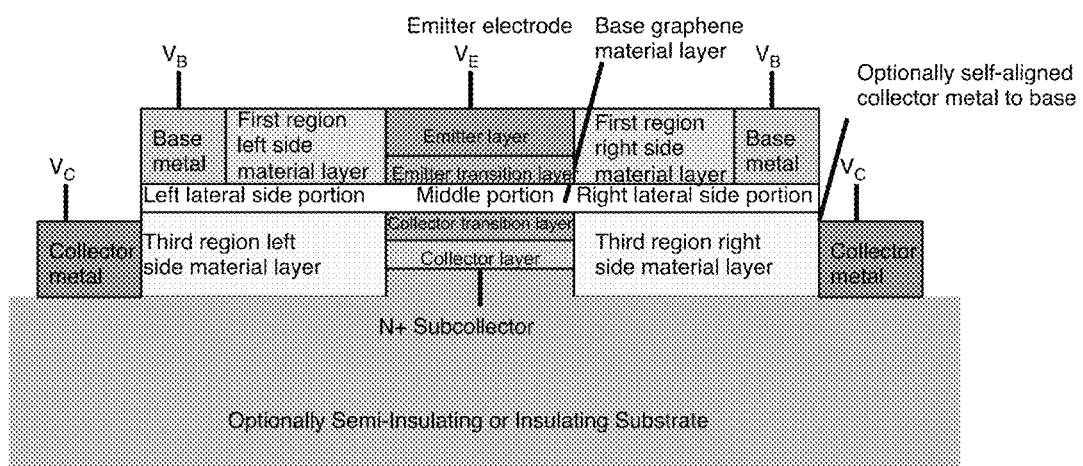
FIG. 1 is an illustration of an example of a graphene base transistor with reduced collector area.
Figure 2:
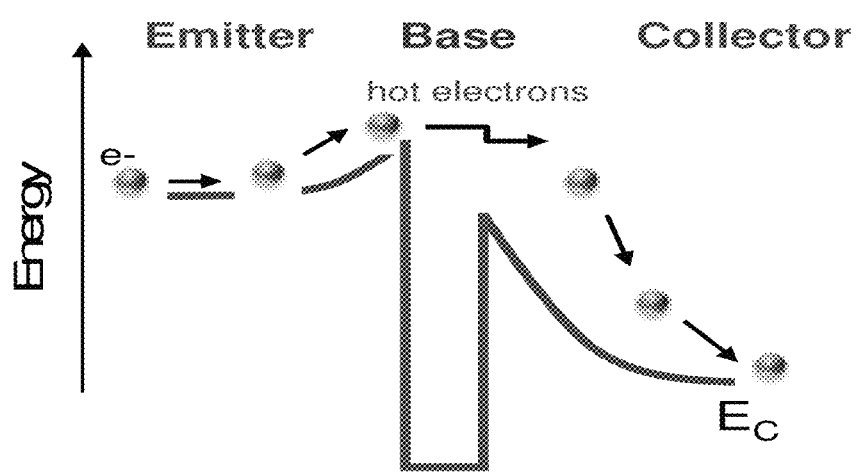
FIG. 2 is an illustration of an energy diagram illustrating the energy of the electrons from emitter to base to collector.
Figure 3:
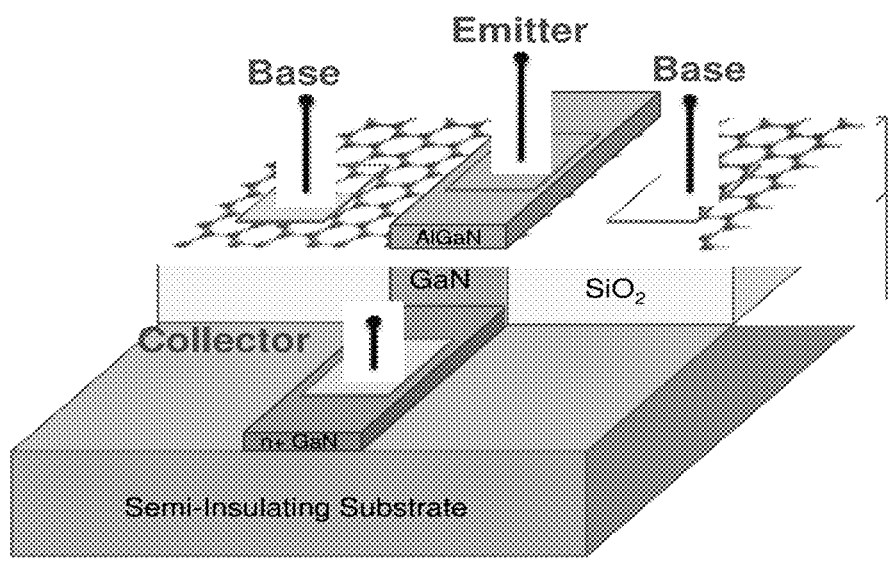
FIG. 3 is an illustration of an example of a graphene base transistor with reduced collector area.
Figure 4:
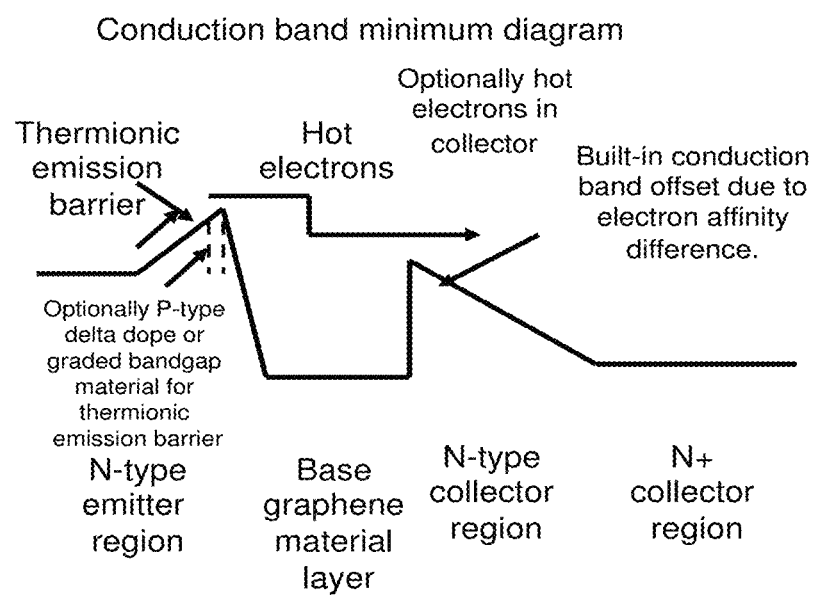
FIG. 4 is an illustration of a conduction band minimum diagram.
Figure 5:
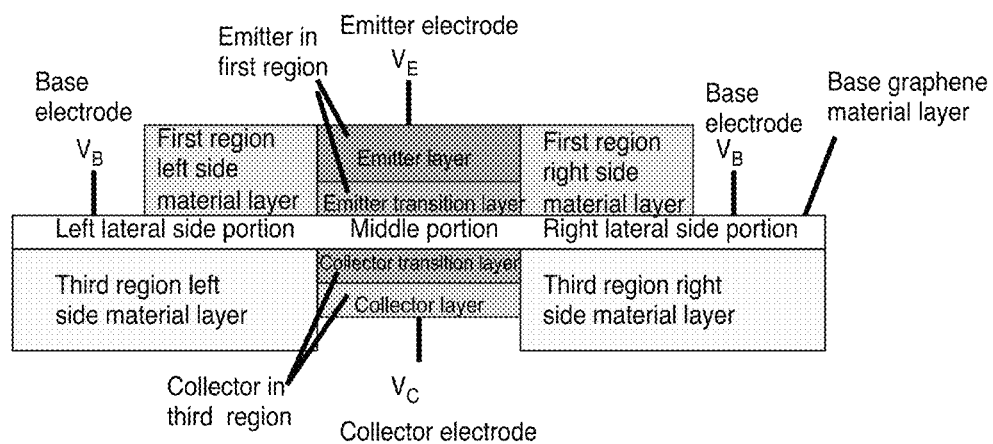
FIG. 5 is an illustration of an example of a graphene base transistor with reduced collector area.
Figure 6:
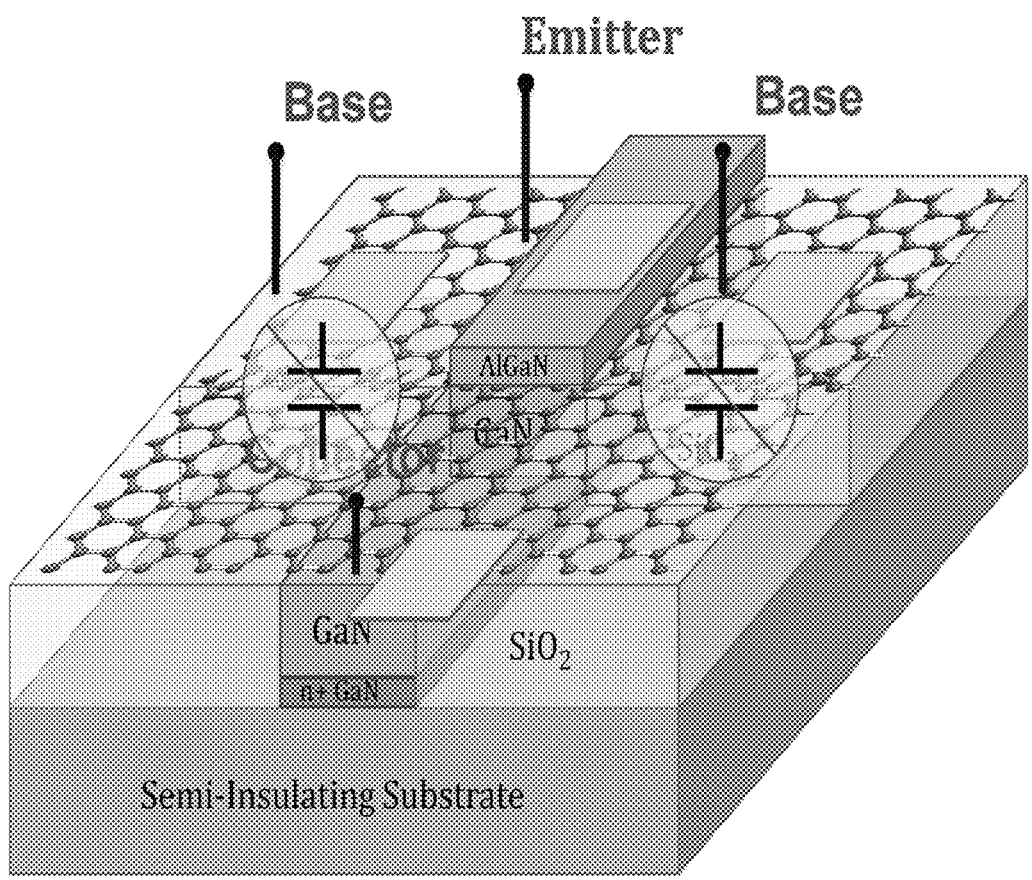
FIG. 6 is an illustration of an example of a graphene base transistor with reduced collector area.
Figure 7:
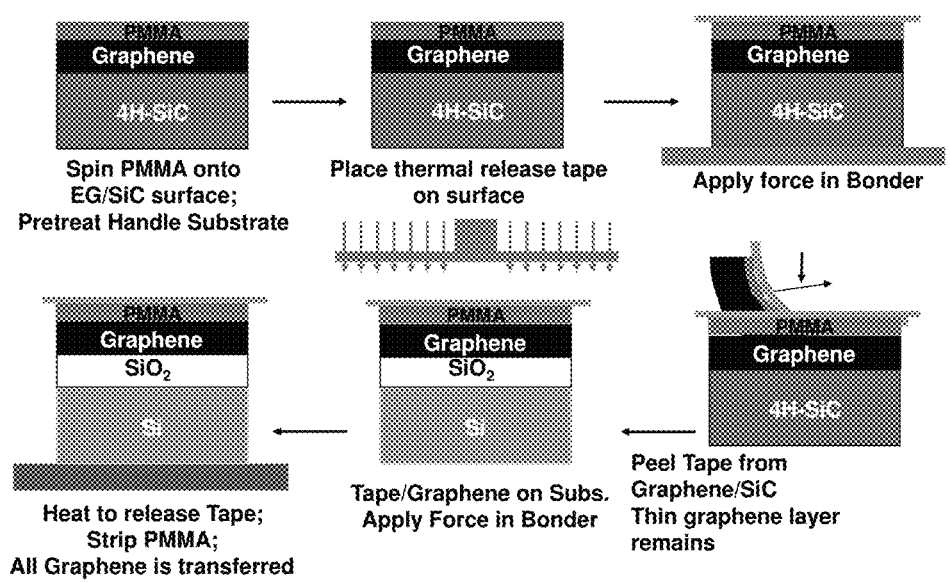
FIG. 7 is an illustration of an example of high uniformity graphene transfer.
Figure 8:
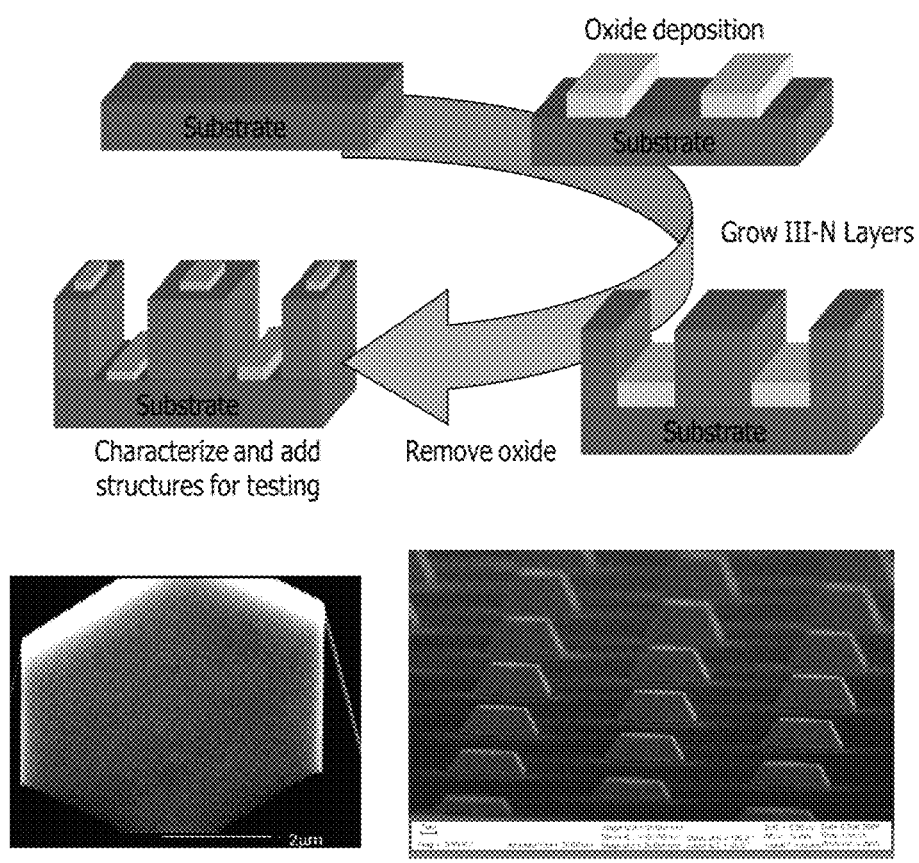
FIG. 8 is an illustration demonstrating an example of confining Ga-polar GaN epitaxy.

This disclosure provides for a graphene base transistor with reduced collector area comprising an electron injection region, an electron collection region, and a base region wherein the base region comprises one or more sheets of graphene and wherein the base region is intermediate the electron injection region and the electron collection region and forms electrical interfaces therewith.

This disclosure provides for a graphene base with lateral side portions on dielectric material with low dielectric constant in the third region right and left side material layer to reduce capacitance of base graphene material layer to the collector (emitter up configuration) or emitter (collector up configuration) in the third region or reduce the capacitance to the subcollector or to the substrate.

Involved here are low-K dielectric materials (optionally having air gaps or porosity structure in low K dielectric materials) and polymer dielectrics.

The base graphene material layer is transfer and wafer bonded to the surface of the collector region (region 2) and also resides on the surface of the region 3 dielectric lateral side material layer.

The first region and third region side material layer can be selected to passivate the sides of the material in Region 1 and/or Region 3.

The third region right or left side material can be a composite material with a dielectric spacer on the side of the material in the third region (either emitter or collector).

The first region and third region side material layer can be a dielectric spacer formed by directional ion or plasma etching (optionally with low ion or plasma energy).

The base contact metal to emitter metal separation is less than one micron.

Self-aligned with base metal or semiconductor first and then emitter formation.

The dielectric spacer has low energy ions and the graphene is a protect layer.

Self-aligned with emitter first and then base metal self-aligned to the emitter.

T-gate formed on emitter that is used to self align the base.

Formed using photolithography patterning and directional etch (optional low energy).

Confined epitaxy growth for the epitaxial material (either epitaxial collector material for emitter up configuration or epitaxial emitter material for collector up configuration) in the third region.

The third region right and left side material layer can be a diamond layer or a composite material layer with diamond with the advantage of improved lateral heat spreading or higher critical electric field for breakdown as one of the material layers in the composite dielectric material.

Collector metal contact to the N+ subcollector can be self-aligned to the base graphene material layer.

Collector metal contact can be partially or completely beneath base graphene material layer separated by a material layer.

The base graphene material layer can be doped (including by intercalation doping) to increase the graphene to semiconductor heterojunction barrier height and lower the base resistance. One approach to doping is to use intercalation doping after emitter region 1 formation.

The base layer can have multiple doping regions to optimize the heterojunction barrier height.

Device structure with ohmic contact resistance to emitter less than $1 \times 10^{-5}$ ohm-cm2.

Ohmic contact to emitter formed by N+ doped graphene/semiconductor heterojunction.

Ohmic contact to emitter formed by semiconductor such as InGaN or InN layer on the surface of Graphene Nitride.

InN emitter for high carrier density and low ohmic contact resistance.

InGaN can be used as the collector.

Emitter-up transistor design.

Collector-up transistor design.

Epitaixal layer grown emitter that has a Thermionic injection structure tunnel emitter, optionally using boron nitride two dimensional material.

The emitter can be formed by selective epitaxial growth.

The collect region can be grown by selective growth using patterned growth.

Transferred electron device.

Schottky collector.

This disclosure describes a semiconductor transistor device and method for fabrication comprising an electron injection region (the first region), an electron collection region (the third region), and a base region (second region) with the base region consisting of one or more sheets of graphene known as the base graphene material layer region that is intermediate the first and third regions and forms electrical interfaces therewith.

The first region comprises an emitter region, and the second region comprises a base region, with typically the emitter region electrically contacting the base region and forming the emitter/base interface. The base region is typically also in electrical contact with third region material and forms the base/collector interface.

The base graphene material layer is larger in lateral dimension than the collector regions and emitter region such that one or more portions of the base graphene material layer (lateral side portion) resides on the surface of a bottom side material layer that is adjacent to the third region (collector region) while at least one portion of the base graphene material layer (middle portion) is in electric contact with the emitter region and the collector regions.

In one exemplary embodiment, the left lateral side portion of the base graphene material layer resides on the surface of at least one third region right side material layer, the right side portion of the base graphene material layer resides on the surface of at least one third region right side material layer, and the middle portion of the graphene base material is in electrical contact with the emitter region and/or the emitter/base interface and the collector region and/or the collector/base interface. A dielectric layer adjacent to the first region will typically reside on the surface of the base graphene material layer.

One advantage of a device structure with lateral portions of the base graphene material layer that reside on the surface of a third region side material layer that can be formed from a dielectric layer with a lower dielectric constant then a semiconductor dielectric constant (or optionally a thin passivation layer and air in the case of a transferred substrate design) is that there will be reduced base-collector capacitance and thus high transistor maximum frequency of oscillation.

Another advantage is because the reduced area collector region (third region) is not formed by undercut, the lateral width of the collector width can be well controlled and have small lateral width. This leads to small base-collector capacitance and thus high maximum frequency of oscillation.

The first and third region side material layer can be a silicon oxide material, silicon nitride material, a boron nitride layer, aluminum nitride, indium aluminum nitride, aluminum gallium nitride, a graphene oxide layer, a fluoridated graphene layer, a diamond layer, a microwave insulating layer, a polymer material, a material with a dielectric constant less than about 4.0, a low-k material layer, a porous material layer, a material with pores that have filled with a gas or partial vacuum, a gas or partial vacuum hermetically sealed, material layers known to those skilled in the art, or combination of material layers filled pores, or combinations of material layers/gas filled pores.

The first and third region side material layers can be selected to reduce the capacitance of the base graphene material layer to collector in the third region. The first and third region side material layers can be selected to provide increased thermal conductance or heat spreading to reduce the junction temperature of heterojunctions in contact with the base graphene material layer.

A device with the emitter region in the first region and a collector region in the third region is typically known as an emitter-up transistor device configuration. A collector-up transistor device with the collector in the first region and emitter in the third region is also disclosed One objective of this disclosure is to describe a semiconductor device comprising an electron injection region (the first region), an electron collection region (the third region), and a second a base region comprising of one or more sheets of graphene known as the base graphene material layer region that is intermediate the first and third regions and forms interfaces therewith. The first region comprises an emitter region, and the second region comprises a base region, with typically the emitter region contacting the base region and forming the emitter/base interface. The base region is typically also in contact with third region material and forms the base/collector interface.

The electrons injected into the base graphene material can be "hot electrons," can have the properties of ballistic transit through the base region, and can be coherent electrons. The electrons injected into the base graphene material can also be injected so that the electrons are not hot electron (Non-Hot Electron) but can have the properties of ballistic transit through the base region.

Further advantages for a graphene base transistor include but are not limited to the following. A primary advantage of graphene is that it has extremely high electric conductivity and low electrical sheet resistance for extremely thin base graphene material layer. One of the critical parameters for transistors is the base resistance and thus, graphene can have a low base resistance even for very thin base graphene material layers. A low base resistance is important to achieve a high maximum frequency of oscillation, fmax. The high electrical conductivity of graphene allows the use of thin base graphene material layer which reduces the transit time of electrons through the base region and also reduces the energy loss of hot electrons in transiting the thin graphene base material.

Some sources indicate that graphene has the potential to have the highest conductivity of any material and can have a higher conductivity of than silver. Experimental results indicate that the resistivity of a single sheet of graphene approximately 3 angstrom thick grown on the silicon face of SiC has a sheet resistance on the order of 750 ohm/square to 1000 ohms/square.

Experimental results also indicate that a graphene sheet grown on the surface of copper can have a sheet resistance of approximately 1200 to 1500 ohms/square. The sheet resistance of few sheets of graphene can be less than 100 ohms/square. The thickness of a few sheets of graphene can be less than 2 nm.

In addition, the high velocity of electrons in the graphene material can lower the base transit time. Thus, the semiconductor device with base graphene material layer can have high fT and high fmax.

The use of graphene for base layer of a transistor can allow high performance AlGaN, GaN, InAlN, and SiC material in the collect transistors.

Also, the collector material can be graded in alloy composition to have reduction in the conduction band minimum in the collector material with a low electron affinity being near the base/collector interface and a larger electron affinity as the separation increases from the base/collector interface.

The graded alloy composition with a graded conduction band minimum provides an electric field that can increase the carrier velocity and thus reduce the carrier transit time in the collector. AlGaN, GaN, InAlN and SiC have extremely high Johnson figure of merit and thus the graphene base transistor can allow high power, high frequency operation.

The use of graphene for base layer of a transistor can allow high performance AlGaN, GaN, InAlN, and SiC materials in the collector of the transistors. Because of the wide bandgap nature of AlGaN, GaN, InAlN and GaN, the graphene base transistor can allow high temperature operation.

The enhanced lateral thermal conductivity of graphene can spread the thermal load to a larger area and thus reduce the thermal resistance.

The maximum oscillation frequency, fmax, for a bipolar transistor is approximately described by the equation $$F\text{max} = (fT/8\pi RbCcb)^{1/2}$$

and thus the maximum frequency of oscillation is inversely proportion to the base resistance, Rb. (where Ccb is the collector base capacitance and fT is the cutoff frequency.

It has been known for some time that a hot electron transistor (HET), especially a ballistic transistor, can potentially be operated at frequencies in excess of those achievable with conventional (diffusive) transistors. Various types of hot electron transistors (HET) have been proposed. One type of HET planar doped barrier transistor or "camel" transistor, uses thermionic injection and comprises emitter, base, and collector, with an appropriately shaped potential barrier between emitter and base, and a second barrier between base and collector. The second type, which is referred to as a tunneling hot electron transfer amplifier (THETA) differs from the first type in having tunnel injection into the base. Both of the above types are unipolar; however, bipolar HETs have also been proposed.

The flow of electrons from emitter to base is controlled in both types by varying the emitter/base barrier potential by means of an applied voltage $V_{eb}$. Similarly, the flow of electrons from the base to the collector can be controlled by means of an externally applied voltage $V_{bc}$ between base and collector. Under normal operating conditions, $V_{bc}$ reverse biases the base/collector junction. Electrons injected from the emitter into the base have energy substantially greater than the thermal energy of the ambient electrons in the base. These "hot" electrons ideally traverse the base without undergoing significant scattering. If the barrier at the base/collector interface is lower than the hot electron energy, then some of the hot electrons can cross the barrier, be transmitted through the depletion region of the collector, and enter the sea of conduction electrons in the collector.

Terms

Electron transport in a crystal is herein defined to be "ballistic" if, in addition to its possible interaction with an accelerating electric field, the electron interacts substantially only with the static part of the lattice potential. Electron transport thus may be ballistic even though the electrons undergo some small angle scattering and/or small energy change.

A conduction electron herein is considered to be a "hot" electron in a given semiconductor region if its energy E is substantially greater than $E_F$, the Fermi energy in the region. Typically, $E > E_f + 10 k_B T$, where k B is the Boltzmann constant, and T is the absolute temperature of the lattice.

A "hot electron" transistor (HET) is a transistor whose operative characteristics are in substantial part determined by the transport of hot electrons through the transit region of the transistor, with minimal scattering of the hot electrons in the transit region.

The "transit region" of a HET herein is that portion of the HET through which substantial hot electron transport takes place, or is intended to take place. For instance, in a PDBT, camel transistor, or THETA device, the transit region consists of the base and the collector depletion region. In order to have the possibility of significant hot electron transport in a HET, the width of the transit region has to be less than the mean-free path of the hot electrons in the material.

Another objective of this disclosure is to describe a semiconductor transistor device comprising an electron injection region (the first region), an electron collection region (the third region), and a second a base region consisting of one or more sheets of graphene known as the base graphene material layer region that is intermediate the first and third regions and forms interfaces therewith. The first region comprises an emitter layer, and the second region comprises a base layer, with typically the emitter layer contacting the base layer and forming the emitter/base interface therewith. The base layer is typically also in contact with third region material and forms the base/collector interface therewith.

Further, the emitter layer is a semiconductor device comprising an n-type emitter layer, a base layer consisting of one or more sheets of graphene known as the base graphene material layer, an n-type collector layer, and an optional emitter transition region interposed between the n-type emitter layer and the base graphene material layer and an optional collector transition region interposed between the base graphene material layer and the n-type collector layer. The base graphene material layer may consist of one or more sheets of graphene that have N-type conduction properties (having predominantly electron conduction), one or more sheets that have P-type conduction properties (having predominantly hole conduction), or a layed structure having one or more sheets with N-type conduction properties and also one or more sheets with P-type conduction properties. The graphene sheets can be doped sheets of graphene. The graphene material in the base can be intercalated doped. The graphene sheet nearest the emitter/base interface can be modified to provide nucleation sites to enable the growth semiconductor material on the modified graphene sheet, the growth of a tunnel insulator such as the growth of a metal oxide layer by atomic layer deposition, or the growth of a boron nitride two-dimensional sheets on the modified graphene sheet. The N-type emitter layer may be a semiconductor, semimetal, a metal or one or more graphene sheets. The N-type collector layer may be a semiconductor, a semimetal, a metal or one or more graphene sheets. The present invention relates to a method for forming a device, comprising steps for providing a substrate having a plurality of semiconductor layers epitaxially grown thereon. The collector region can be formed on a silicon, germanium, InP, GaAs, InAs, InGaAs, GaSb, SiC, GaN, ZnO, AlN, or metal substrate known to those skilled in the art using homoepitaxial growth, heterojunction epitaxial growth, psuedomorphic growth, methomorphic growth, graded epitaxial growth, direct wafer bonding, or transferred substrate approaches.

The transistor device also comprise electrode means for making electrical contact with the first, second and third regions, respectively, and means for injecting hot electrons from the first into the second region.

Certain embodiments of the present invention include, but are not limited the embodiments listed below.

Example 1

Method to Form Graphene Right and Left Lateral Side Portions Over Top a Third Region Right and Left Side Materials Using Chemical Mechanical Polishing.
1. Form collector material on a substrate. The collector material can be a epitaxial grown semiconductor material.
2. Optionally deposit a material protection layer on the surface of the collector material.
3. Deposit a dielectric in the Third Region Right and Left Side material. The dielectric preferably has low dielectric constant. Low-K material be used in the region below the graphene base material layer.
4. Planarize the dielectric in the Third Region Right and Left Side material to the top surface of the optional material protection layer using chemical mechanical polishing.
5. Etch the material protection layer to the top surface of the collector material.
6. Clean and remove the native oxide on the top surface of the collector material.
7. Transfer and Bond base graphene material layer from a second copper or nickel to the top surface of the graphene material layer.
8. Photostep to define graphene material layer to the top surface of graphene material layer.

Example 2

Method to Form Graphene Right and Left Lateral Side Portions Over Top a Third Region Right and Left Side Materials Having Collector Contact Electrode Material/Dielectric Layer Beneath the Base Graphene Material Layer.
1. Form collector material on a substrate. The collector material can be a epitaxial grown semiconductor material.
2. Form contact metal electron on an N+ subcollector.
3. Optionally deposit a material protection layer on the surface of the collector material.
4. Deposit a dielectric in the Third Region Right and Left Side material.
5. Planarize the dielectric in the Third Region Right and Left Side material to the top surface of the optional material protection layer using chemical mechanical polishing.
6. Etch the material protection layer to the top surface of the collector material.
7. Clean and remove the native oxide on the top surface of the collector material.
8. Transfer and Bond base graphene material layer from a second copper or nickel to the top surface of the graphene material layer.
9. Photostep to define graphene material layer to the top surface of graphene material layer.

Example 3

Method to Form Graphene Right and Left Lateral Side Portions Over Top Diamond Material Layer in Third Region Right and Left Side Materials Using Chemical Mechanical Polishing.
1. Form collector material on a substrate. The collector material can be a epitaxial grown semiconductor material.
2. Optionally deposit a material protection layer on the surface of the collector material.
3. Deposit a diamond material layer in the Third Region Right and Left Side material.
4. Planarize the dielectric in the Third Region Right and Left Side material to the top surface of the optional material protection layer using chemical mechanical polishing.
5. Etch the material protection layer to the top surface of the collector material.
6. Clean and remove the native oxide on the top surface of the collector material.
7. Planarize to the top surface of the optional material protection layer.
8. Transfer and Bond base graphene material layer from a second copper or nickel to the top surface of the graphene material layer.
9. Photostep to define graphene material layer to the top surface of graphene material layer.

Example 4

Method to Form Graphene Right and Left Lateral Side Portions Over Top a Dielectric in a Third Right and Left Regions Using Confined Epitaxial Growth Approach
1. Deposit a dielectric layer such as an oxide layer or an silicon nitride layer on a substrate.
2. Photostep to define regions to etch the oxide to the III-Nitride surface.
3. Selective epitaxial grow III-nitride collector material in the oxide opening.
4. Clean and remove the native oxide on the top surface of the collector material.
5. Transfer and bond base graphene material layer from a second copper or nickel to the top surface of the graphene material layer.
6. Photostep to define graphene material layer to selected regions of the top surface of graphene material layer.
7. Epitaxially grow III-nitride emitter material on the graphene surface.
8. Optionally form first region right and left side dielectric material layer on the side surface of the emitter material. The first region right and left side dielectric material layer can be dielectric spacer.
9. Form emitter electrical contact electrode, based contact electrode, and collector contact electrode.

Example 5

Method to Form Graphene Right and Left Lateral Side Portions Over Top a Diamond Material in a Third Right and Left Regions Using Confined Epitaxial Growth Approach
1. Deposit a diamond material on a substrate. Optionally deposit a oxide layer or an silicon nitride layer on the surface of the diamond.
2. Photostep to define regions to etch the oxide/diamond layers to the III-Nitride surface.
3. Selective epitaxial grow III-nitride collector material in the oxide/diamond opening.
4. Optionally chemically etch the oxide layer to remove the oxide layer from the top surface of the diamond.
5. Clean and remove the native oxide on the top surface of the collector material.
6. Transfer and bond base graphene material layer from a second copper or nickel.
7. Transfer and bond base graphene material layer from a second copper or nickel to the top surface of the graphene material layer.
8. Photostep to define graphene material layer to selected regions of the top surface of graphene material layer.
9. Epitaxially grow III-nitride emitter material on the graphene surface.
10. Optionally form first region right and left side dielectric material layer on the side surface of the emitter material. The first region right and left side dielectric material layer can be dielectric spacer.
11. Form emitter electrical contact electrode, based contact electrode, and collector contact electrode

Example 6

Method to Form Base Transistor with Reduced Collector Area Having Graphene Right and Left Lateral Side Portions Over Top a Dielectric in a Third Right and Left Regions Using Confined Epitaxial Growth Approach
1. Deposit a dielectric layer such as an oxide layer or an silicon nitride layer on a substrate. The substrate can optionally be semi-insulating or insulating substrate to reduce the collector capacitance and improved the microwave performance. Optionally grow an N+ subcollector epitaxial layer on a substrate
2. Photostep to define regions to etch the oxide to the III-Nitride surface.
3. Selective epitaxial grow III-nitride collector material in the oxide opening.
4. Clean and remove the native oxide on the top surface of the collector material.
5. Transfer and bond base graphene material layer from a second copper or nickel to the top surface of the collector material.
6. Photostep to define graphene material layer to selected regions of the top surface of graphene material layer.
7. Epitaxially grow III-nitride emitter material on the graphene surface.
8. Optionally form first region right and left side dielectric material layer on the side surface of the emitter material. The first region right and left side dielectric material layer can be dielectric spacer.
9. Form emitter electrical contact electrode, based contact electrode, and collector contact electrode.

Example 7

Method to for Small Base-Emitter Lateral Separation Using T-Gate Metal
1. Deposit a dielectric layer such as an oxide layer or an silicon nitride layer on a substrate.
2. Photostep to define regions to etch the oxide to the III-Nitride surface.
3. Selective epitaxial grow III-nitride collector material in the oxide opening.
4. Clean and remove the native oxide on the top surface of the collector material.
5. Transfer and bond base graphene material layer from a second copper or nickel to the top surface of the graphene material layer.
6. Photostep to define graphene material layer to selected regions of the top surface of graphene material layer.
7. Form emitter in first region on base graphene material layer.
8. Use combination of lithography and metal evaporation to form a T-emitter metal on top surface of emitter.
9. Optionally form dielectric on emitter sidewall.
10. Photostep to define region for base metal.
11. E-beam evaporated base metal that is self-aligned to the T-gate metal.
12. Form collector electrical contact level.

Example 8

Method for Small Base-Emitter Lateral Separation Using Base Contact Material Prior to Emitter
1. Deposit a dielectric layer such as an oxide layer or an silicon nitride layer on a substrate.
2. Photostep to define regions to etch the oxide to the III-Nitride surface.
3. Selective epitaxial grow III-nitride collector material in the oxide opening.
4. Clean and remove the native oxide on the top surface of the collector material.
5. Transfer and bond base graphene material layer from a second copper or nickel to the top surface of the graphene material layer.
6. Photostep to define graphene material layer to selected regions of the top surface of graphene material layer.
7. Form base graphene material layer on the top surface of the collector in the third region and on the Third Region Right and left side material. One approach of forming the base graphene material layer on the collector third region and on the Third region Right and Left side material is to transfer graphene from a second metal substrate such as copper or nickel and then bond to the top surface of the collector third region and on the Third region Right and Left side material.
8. Optionally deposit Graphene protect layer. Examples of graphene protect layer are AlN or BN. The graphene protect layer can be grown by atomic layer deposition or atomic layer epitaxy or by transfer and bond materials such as 2D boron nitride.
9. Form dielectric spacer on sidewall of base contact material.
10. Etch exposed graphene protect layer.
11. Epitaxially grow emitter material in the first region.
12. Form base emitter and collect electrically electrode contact.

Example 9

Approach for Small Base-Emitter Lateral Separation Using Base Contact Material Prior to Emitter
1. Deposit a dielectric layer such as an oxide layer or an silicon nitride layer on a substrate.

2. Photostep to define regions to etch the oxide to the III-Nitride surface.
3. Selective epitaxial grow III-nitride collector material in the oxide opening.
4. Clean and remove the native oxide on the top surface of the collector material.
5. Transfer and bond base graphene material layer from a second copper or nickel to the top surface of the graphene material layer.
6. Photostep to define graphene material layer to selected regions of the top surface of graphene material layer.
7. Form base graphene material layer on the top surface of the collector in the third region and on the Third Region Right and Left side material. One approach of forming the base graphene material layer on the collector third region and on the Third region Right and Left side material is to transfer graphene from a second metal substrate such as copper or nickel and then bond to the top surface of the collector third region and on the Third region Right and Left side material.
8. Form Bask contact material in the second and third region.
9. Form dielectric spacer on sidewall of base contact material.
10. Epitaxially grow emitter material in the first region.
11. Form base emitter and collect electrically electrode contact.

Hot Electron Injection

For the case that the conduction band minimum of the N-type emitter layer is higher than the conduction band minimum of the base graphene material layer, the electrons will be injected into the base graphene material layer with energy and the electrons will be known as "hot electrons." These "hot electrons" ideally traverse the base without undergoing significant scattering. If the base/collector conduction band minimum is caused to be lower than the hot electron energy then some of the hot electrons can cross into the N-type collector layer. For a properly designed N-type collector layer, the electrons can also be hot electrons in the N-type collector layer. The electrons can be transmitted through the depletion region of the collector, and enter the sea of conduction electrons in the N-type collector layer. The transistor device of interest herein also comprises means for injecting hot electrons from the first into the second region.

The electrons that transit the base region can be ballistic electrons meaning that they pass through the base layer and optionally the collector region at a high speed substantially without scattering (ballistic conduction). At least a substantial fraction of the injected hot electrons transit the base region without substantial energy loss and cross the base/collector interface.

The electrons that transit the base region can also be coherent electrons.

The graphene base layer may be selected to have quantum levels.

Non-Hot Electron Injection

For the case that the conduction band minimum of the N-type emitter layer is lower than the conduction band minimum of the base graphene material layer, the electrons will not be injected into the base graphene material layer as "hot electrons." The electrons can transit the base graphene material by diffusive transport, ballistic transport, and/or coherent transport. While the electrons in the graphene base layer are not hot electrons for this case, the electrons can be injected from the base graphene material layer into the collector region as hot electrons.

Optional Emitter Transition Region

The optional emitter transition region interposed between the n-type emitter layer and the base graphene material layer for the case of hot electron injection into the base graphene material layer can be used to implement a tunneling barrier, a Fowler Nordheim injection barrier, a thermionic barrier, or other barriers known to those skilled in the art for hot electron injection into the base graphene material layer.

The emitter transition region may consist of a P-type doped barrier layer, a NIPI type barrier layer, delta-doped barrier layer, planar doped barrier layer, a "camel" barrier layer, a tunneling insulting insulator barrier layer for direct tunneling, a tunneling insulting layer formed from two-dimensional boron nitride material that is one to ten sheet thick, a thin insulator layer for Fowler Nordheim injection, an atomic layer deposited boron nitride layer for direct tunneling or Fowler Nordheim injection, a two-dimensional boron nitride layer for direct tunneling or Fowler Nordheim injection, a semiconductor barrier for direct tunneling, a semiconductor barrier for Fowler Nordheim injection, a resonant tunneling structure consisting of two semiconductor direct tunneling barriers, a graded semiconductor layer to implement a thermionic barrier, a superlattice semiconductor layer, a graphene layer converted to a tunneling insulating material, a fluorinated graphene tunneling layer, a graphane layer, a diamane layer, a semiconductor/graphene heterojunction, a semiconductor/graphene Schottky barrier, a thermionic barrier implemented as a result of electron affinity differences, a thermionic barrier implemented as a result of surface states and surface traps within the semiconductor bandgap at the semiconductor/graphene interface, a thermionic barrier implemented as a result of a "pinned" semiconductor/graphene interface, and combinations thereof.

An objective of the emitter transition region is to inject electrons into the base layer with sufficient energy to transit the base layer and be collected in the collector region and also to allow a voltage to be applied between the N-type emitter layer and the graphene base material layer with a high ratio of emitter current (IE) to base current (IB), i.e., high IE/IB ratio. Thus, it is desirable that the emitter transition region be designed so that the injection of base current into the emitter region is minimized.

The hot electrons can lose energy as they transit the base region due to optical phonon scattering and other scattering events. The energy at which the hot electrons are injected from the emitter into the base should include any additional energy needed to overcome the energy loss due to optical phonons and other scattering events during the transit of electrons through the base region.

The optional emitter transition region interposed between the n-type emitter layer and the base graphene material layer for the case of "non-hot electron" injection into the base graphene material layer can include bandgap smoothing graded semiconductor material to facilitate the injection of electrons from the emitter region into the base graphene material region.

Optional Collector Transition Region

The optional collector transition region interposed between the base graphene material layer and the N-type collector layer for the case of hot electron injection into the base layer may consist of a P-type doped region, a NIPI type of layer, delta-doped layer, planar doped barrier layer, a "camel" layer an insulator layer, a tunneling insulator layer, a boron nitride layer, a tunneling boron nitride layer, a tunneling semiconductor layer, a graded semiconductor layer, a superlattice semiconductor layer, a graphene layer converted to an insulating material, a fluorinated graphene layer, a heterojunction, a graphene Schottky barrier and combinations thereof. It is the objective of the collector transition region to facilitate the collection of electrons that transit the graphene base material layer into the N-type collector layer and also to allow a voltage to be applied between the graphene base material layer and the N-type collector layer.

The collector transition region can be designed to minimize the quantum mechanical reflection of the hot electrons by the collector transition region. In the case that an offset potential barrier exist between the conduction band minimum of the base graphene material layer and the conduction band minimum of the N-type collector layer, the collector transition region can be a bandgap smoothing transition region used use to smooth the potential barrier (grade the potential in the collector transition region) to facilitate the collection of electrons into the collector layer. For example, the bandgap smoothing transition region can comprise a layer of compositionally graded indium gallium arsenide (InGaAs) or InGaAsN or other semiconductor material.

In operation, a voltage difference (potential difference) is affected between the emitter region terminal and the base graphene material layer terminal to modulate the amount of electrons injected into the base layer. A voltage difference (potential difference) is effected between the base graphene material layer terminal and the collector region terminal to collect the electron that are injected by the emitter region that transit through the base graphene material layer and are collected into the collector region.

Forming Base Graphene Material Layer

The base graphene material layer can be formed on the collector region by epitaxial growth of one or more sheets of graphene on the surface of the collector region material layer (or the surface of the optional collector transition region material). The base graphene material layer can also be formed by the transfer of and bonding of one or more sheets of graphene that is grown on the surface of a substrate.

In the transfer and bond approach, graphene sheets are first grown on a substrate such as SiC, copper, nickel or other substrates known by those skilled in the are using CVD, sublimation of silicon as is the case for SiC, or solution growth and by other techniques as known by those skilled in the art.

In one example of the transfer and bond approach, a heat releasable tape is adhered to the top surface of the graphene sheet material that is formed on a substrate, the heat releasable tape is lifted from the surface of the substrate with graphene sheets attached to the bottom surface of the heat releasable table. The surface of the collector region material to receive the graphene sheet or sheets is suitably prepared for direct bonding of the graphene sheets.

The process of suitably preparing the surface of the collector region material may include appropriate cleaning and in some cases by appropriate treatment for improving the bond strength of the graphene sheet or sheets to the surface of the collector region material. The surface of the graphene sheets is then brought into direct contact to the surface of the collector region material and the bonding forces present between the surface of the graphene sheet and the collector region material such as van der Waals bonding forces will bond the graphene sheet to the collector region material. The bond strength of the graphene sheets to the collector region material can be improved by appropriate charging the surface of the collector region and/or graphene sheets by exposing the surface to plasma or corona.

The bond strength of the graphene sheet to the graphene surface can also in some cases be improved by forming hydroxyl ions HO— on the surface of the collector region material. For the purposes of this invention, it is necessary that the electrons are able to transport across the interface between the graphene sheets (base region) and the collector region material.

It is thus generally desirable that if insulating material such as a native oxide or deposited insulator or grown insulator exist on the surface of the collector region material, that the insulating material be sufficiently thin that electrons can transmit from the base region into the collector region (transit by tunneling) with only small perturbation to the electron transit across the interface.

In many cases it is desirable to not have an insulating material on the surface of the collector region material so that electrons can readily transit from the base region into the collector region. In this case, the surface of the collector region material is prepared in a suitable manner to minimize the native oxide on the surface. The surface of the collector region material can also be prepared to minimize the number of surface states and band bending on the surface of the collector region material.

For example, it is known that forming fluorine atoms on the surface of GaN will remove the band bending at the surface of GaN. There are other approaches for reducing surface stages and band bending on the surface of the collector region material and thus at the interface of the graphene sheets/collector region material known by those skilled in the art.

There are multiple growth techniques of forming P-type graphene material layers. Graphene sheets that are grown on the carbon face of SiC are often P-type. Graphene sheets intercalated with gold is P-type. Graphene grown by CVD on a copper film are also doped P-type. Graphene sheets grown on the carbon face of SiC are often P-type. Annealing in ammonia ambient or in a nitrogen ambient can form n-type graphene. Graphene grown on the silicon face of SiC are often N-type Forming Emitter Region Material The emitter region material may include semiconductor, semimetal, metal, tunneling insulator, or graphene material appropriate for injecting electrons into the base graphene material layer. The emitter region material will typically have N-type doping or selected from a metal with an appropriate work function for injecting electrons into the base graphene material layer.

The emitter region material can be formed by deposition, doping, or by direct bonding of emitter region material (and optional collector transition region material) onto the surface of the base graphene material layer. The deposition approaches can include epitaxial growth, chemical vapor deposition growth (CVD), plasma enhanced CVD growth, atomic layer epitaxy growth, atomic layer deposition growth, sputter deposition, ion beam deposition, E-beam evaporation, and other deposition techniques known to those skilled in the art.

The emitter region material can be single crystal material, polycrystalline material, high oriented material, amorphous material, metal material, and organic material.

The preferred approach to form the emitter region material is by epitaxial growth of single crystal or highly oriented material on the base graphene material layer.

Many candidate emitter region materials will have a large lattice mismatch to the base graphene material layers. Candidate epitaxial growth approaches include metamorphic, psuedomorphic, and Van der Waals epitaxial approaches and other epitaxial growth approaches known to those skilled in the art. Van der Waals epitaxy approach can be used to aid in accommodating the large lattice mismatch. The grains of the highly oriented, polycrystalline, or amorphous emitter region material can be passivated with hydrogen atoms or fluorine atoms.

The emitter transition region can include the formation P-type doped region, a NIPI type of layer, delta-doped layer, an insulator layer, a tunneling insulator layer, a boron nitride layer, a tunneling boron nitride layer, a resonant tunneling structure, a tunneling semiconductor layer, a graded semiconductor layer, a superlattice semiconductor layer, a graphane layer, a graphene layer converted to an insulating material, a fluorinated graphene layer, a heterojunction, a Schottky barrier, and combinations thereof. A boron nitride tunneling insulator has excellent lattice match to base graphene material layer.

One approach to increase the number of nucleation sites for the growth of semiconductor material film (or graphene interface transition layer) on the graphene sheet on the first surface of the graphene material layers is to increase the density of sp3 hybridation in the graphene sheet on the first surface of the graphene material layer.

There are a number of techniques for breaking the sp2 pi-bonds in the graphene sheet and forming sp3 bonds on the first surface graphene sheet. These techniques include exposing the surface of the graphene material layer to a plasma or UV generated atomic species such as atomic hydrogen, atomic oxygen, and atomic fluorine, exposing to UV ozone, exposing to an oxidation process, exposing to a hydrogenation process, exposing to fluorine, exposing to HNO3 acid, exposing to $H_2SO_4$:$HNO_3$ acid, exposing to HNO3 and octadecylamine, exposing to dichlorocarbene, exposing to ion bombardment, exposing to ion milling, reactive ion etching, electron cyclotron resonance (ECR) etching, Inductively coupled plasma (ICP) etching, exposing to electron beam irradiation, exposing to laser irradiation, exposing to X-ray irradiation, or exposing to xenon difluoride gas, or other techniques known to those skilled in the art.

The sp3 bonds can be passivated with carboxyl atoms by exposing graphene sheet to $HNO_3$ acid. The sp3 bonds can be passivated with by carbon-hydrogen, carbon-oxygen, carbon-fluorine, carbon-nitrogen bonds, or other atoms depending on the background ambient that is in the chamber of the process tool at the time the sp3 bonds are created by irradiation processes.

In the case of creating in a vacuum, upon exposure to the ambient. The UV ozone, oxidation, and acid approach will tend to create carbon-oxygen bonds on the graphene material surface. The covalently bonded hydrogen, oxygen, fluorine, nitrogen, or hydrogen atoms will desorb from the graphene material layer surface at high anneal temperatures. If the anneal is in a vacuum, the broken sp2 bonds (that is, sp3 bonds) will tend to reheal and convert back to an sp2 bond.

The process used to create the sp3 bonds can be performed in the same system that was used to grow the semiconductor material film (or graphene interface transition layer), can be performed in one chamber of a cluster tool and the semiconductor material layer growth performed in a second chamber of the cluster tool, or can be performed in separate process tools with exposure of the first graphene surface to the ambient during transfer between tools.

The first surface of the graphene material layer can have discontinuous sheets 307 with there being a high density of sp3 bond and unbonded carbon bonds at the edges (step edges) 301 of the discontinuous sheets of graphene.

The sp3 bonds and the unbonded carbon bonds at the step edges can act as nucleation sites bonding of deposited atoms needed to form the semiconductor material film.

The semiconductor material film atoms can initially nucleate at these sp3 bonds and the unbonded carbon bonds and then additional semiconductor material film atoms can grow laterally and vertically from the initial nucleation site. If the density of nucleation sites is sufficiently high, then the lateral extent of the semiconductor material film can merge at boundaries and form a continuous semiconductor material film on the surface of the graphene material.

In addition, to the step edges occurring naturally, a high density of step edges with a high density of nucleation sites can be created by lithography 304 and other self-assembly approaches. For example, the step edges 304 can be formed by lithography to form patterns on the graphene material layer surface followed by an etch process to subtractive etch one sheets of the graphene material layer.

Also, self-assembly approaches such as nanosphere lithography consisting of forming nanoparticles on the graphene material layer surface and using the nanoparticles as masking layer for etching of one or more graphene sheets to create step edges 304 that can act as nucleation sites for the growth of the semiconductor material film.

Step edges can also be created on the surface of the graphene layer by exposing the graphene material layer to a process that reactively etches the graphene material layer. It will typically be the case that there are random defects, sp3 carbon bond sites, or weak spots in the graphene film where the reactive etching will initiate. The reactive etching will then spread laterally from this initial etching spot to enlarge the reactive etching area.

Approaches that can reactively etch graphene include exposing the graphene material layer to atomic hydrogen, UV ozone, atomic oxygen, atomic fluorine, molecular fluorine, xenon difluoride, oxidation, reactive ion etching, or ICP etching.

The reactive etching approach can also create random sp3 bond sites in the graphene sheet which will then be sites where the reactive etching can be enhanced and thereby form step etches. Other approaches such as sputtering or ion milling with sufficiently high energy ions will tend to etch (sputter) the graphene sheet in a uniform manner and create a high density of sp3 carbon bond. If the sputtering or ion milling ion energy is low, the ion impact on the graphene surface will create sp3 bonds.

Electron beam irradiation as well as X-ray irradiation of the graphene sheet can also create sp3 bonds. Electron beam, focused ion beam, and ion beam lithography techniques can be used to pattern location well sp3 bonds will be created on the graphene sheet first surface 306. There can be a combination of processes to create sp3 bond and reactive etching.

For example, an ion mill or e-beam process can be performed to create sp3 bond followed by an etching process to create step edges. Hydrogen molecule anneal can be preformed to create hydrogen bubbles beneath the graphene sheet and when a sufficiently high pressure is achieved, that exfoliate the top surface of the graphene sheet in selected regions.

There are additional approaches to create graphene sheet step edges that can act as nucleation sites for graphene material film (and graphene interface transition layer). These approaches include forming graphene nanoribbons, forming graphene antidot array, forming an artificially structured graphene sheet, or forming other suitable pattern to create a large number of step edge.

Another approach to increase the density of nucleation sites for the growth of a semiconductor material layer includes growing graphene with a high density of defects or grain boundaries. It can be preferable that the defect be formed in the graphene sheet of first surface of the graphene material layer. Graphene that has small grain size will have sites for nucleation sites at the grain boundary for the growth of the semiconductor material film.

In addition, graphene material layers can be grown to have nanograins that will provide a high density of nucleation site for the growth of graphene material layer.

The emitter region may be formed by doping. In this case, a top graphene sheet or sheets can be doped N-type in a manner that is appropriate for injecting electrons into a P-type base graphene material layer. Approaches to dope graphene N-type include annealing in ammonia, annealing in nitrogen, and other approaches known to those skilled in the art. A N-type graphene/P-type graphene interface can act as a tunnel junction.

The emitter region material may be formed by wafer bonding emitter region material to the base graphene material layer. The approaches include direct bonding semiconductor, semimetal, organic, or graphene sheet or sheets material to the surface of the base graphene material layer.

One approach is to transfer and bond N-type graphene sheet or sheets to a P-type base graphene material layer. Other approaches include bonding a layered material having a thin semiconductor or thin semimetal layer on the surface. The thick portion of the layered material can then be selectively etched to leave a thin semiconductor or thin semimetal layer bonded to the surface of the graphene material layer.

An alternate approach to form a thin semiconductor, thin semimetal, or thin N-type graphene material layer bonded to the surface of the base graphene material layer is to use a Smart Cut approach of implanting hydrogen or helium to a depth within the thin semiconductor or thin semimetal layer, or beneath the thin semiconductor or semimetal layer. A heating operation then causes the hydrogen and or helium to expand, and split off the thick portion of the layer material as known to those skilled in the art. The remaining portion of the thick layered material can then be etched to the thin semiconductor, semimetal, or N-type graphene material layer.

Emitter Region Material Selective Growth

For a topside emitter transistor structure, it is desirable that the material for the emitter region be deposited in a selective or patterned approach to facilitate electric contact to the graphene base material layer. Alternately, to facilitate electrical contact to the base graphene material layer, the electric contact to the base graphene material layer can be formed, spacer dielectrics formed on the sides of the graphene base material layer contact, and the emitter region material layer formed as known by those skilled in the art.

Offset in Conduction Band Minimum

The offset in potential of the conduction band minimum of the emitter region material or collector region material and the conduction band minimum of the base graphene material layer can be estimated by using the difference in electron affinity of the two material systems.

TABLE I

Electron Affinity

| | Electron Affinity | Conduction Band Offset to Graphene |
|---|---|---|
| Graphene | 4.5 eV | |
| CdSe | 4.95 eV | −0.45 eV |
| InAs | 4.9 eV | −0.4 eV |
| SnO2:F | 4.8 eV | −0.3 eV |
| InSb | 4.59 eV | −0.09 |
| ZnO | 4.5 eV or 4.35 | 0.0 eV or 0.15 eV |
| BN | 4.5 eV | 0.0 eV |
| CdTe | 4.5 eV | 0.0 eV |
| CdS | 4.5 eV | 0.0 eV |
| In2O3:Sn | 4.5 eV | 0.0 eV |
| InGaN | 4.1-4.59 eV | −0.4 eV |
| InAsP | 4.38 to 4.9 eV | −0.4 to 0.12 eV |
| InP | 4.38 eV | 012 eV |
| InGaAs | 4.1 to 4.9 eV | −0.4 to 0.4 eV |
| InAlAs | 4.1 to 4.9 eV | −0.4 to 0.4 eV |
| InGaSb | 4.1 to 4.59 eV | −0.09 to 0.4 eV |
| InN | | |
| InAsN | | |
| Diamond | 4.2-4.5 eV | 0.0 to 0.3 eV |
| GaN | 4.1 eV or 4.3 eV | 0.2 or 0.4 eV |
| GaAs | 4.07 eV | 0.43 eV |
| Silicon | 4.05 eV or 4.29 | 0.45 eV |
| 4H-SiC | 4.05 eV | 0.45 eV |
| GaSb | 4.05 eV | 0.45 eV |
| Germanium | 4.0 eV | 0.5 eV |
| AlP | 3.98 eV | 0.52 eV |
| ZnS | 3.9 eV | 0.6 eV |
| GaP | 3.8 eV | 0.7 eV |
| AlSb | 3.65 | 0.85 eV |
| AlAs | 3.5 eV | 1.0 eV |
| AlN | 0.6 eV | 3.9 eV |

Examples of Semiconductor Materials for "Non Hot Electron" Graphene Transistors

Semiconductor, semimetal and metal materials that have an electron affinity that is larger than that for graphene (larger than an electron affinity of 4.5 eV) will have a conduction band minimum that is smaller than the conduction band minimum of the base graphene material layer. By forward biasing the emitter base junction, electrons can injected into the base graphene material layers that are not hot electrons (Non-Hot Electron). From the electron affinity values in Table I, examples of candidate semiconductor materials for the emitter region that have the potential to inject electrons in to the base graphene material layer that are Non-Hot Electrons include Semiconductor Material for Non-Hot Electron Injection (SMNHEI) CdSe, InAs, SnO2:F, InSb, ZnO, BN, CdTe, CdS, In2O3:Sn, InGaN, InAsP, InP, InGaAs, InAlAs, InGaSb, and diamond.

For the case that electrons that are injected into the base graphene material layer that are not hot electrons, it is desirable that there not be a potential barrier at the transition region between the base region and the collector region. It is thus desirable to have semiconductor, semimetal or metal layers that have a potential minimum of the collector region material is lower than the potential minimum of the base graphene material layer. Examples of candidate semiconductor that can be used for the collector region that have the potential to have a small potential barrier or no potential barrier at the collector transition region include Semiconductor Material for Non-Hot Electron Collection (SMNHEC) CdSe, InAs, SnO2:F, InSb, ZnO, BN, CdTe, CdS, In2O3:Sn, InGaN, InAsP, InP, InGaAs, InAlAs, InGaSb, and diamond. Bandgap grading approaches can also be used to reduce potential barriers at the collector transition region.

Examples of Semiconductor Materials for "Hot Electron" Graphene Transistors

Semiconductor and semimetal materials that have an electron affinity that is smaller than the electron affinity of graphene (smaller than an electron affinity of 4.5 eV) have the potential to inject electrons into the base graphene material layers that are hot electrons. From the electron affinity values in Table I, examples of candidate semiconductor materials that have the potential to inject electrons in to the base graphene material layer that are Hot Electrons Semiconductor Material for Hot Electron Injection (SM-HEI) include InGaN, InAsP, InP, InGaAs, InAlAs, InGaSb, Diamond, GaN, GaAs, Silicon, 4H-SiC, GaSb, Germanium, AlP, ZnS, GaP, AlSb, AlAs, and InGaN, AlN.

For the case that the material such InGaN, InAsP, InP, InGaAs, InAlAs, InGaSb, Diamond, GaN, GaAs, Silicon, 4H-SiC, GaSb, Germanium, AlP, ZnS, GaP, AlSb, AlAs, or InAlN, AlN is used for the collector region, it will likely be necessary that the electron be injected in to base region that are hot electrons to overcome the potential barrier that forms at the base collector region.

Large Current Gain and Voltage Mode Operation for P-type Base Graphene Material Layer Many of the emitter region materials described above have a relative small potential offset (or even negative potential offset for the case of hot electron injection) between the conduction band minimum in the emitter region and the conduction band minimum in the graphene. Also, for many of the emitter region materials described above, there is a relatively large potential offset between the valence band of the graphene and the valence band of the emitter region material.

Because of the large potential offset between valance bands, it will be difficult to inject holes from the P-type base graphene material layer into the valance band in the emitter region material while at the same time, there is little potential offset to inject electrons from the emitter region into the base graphene material layer. Thus, the current gain of the graphene base transistor is defined as the ratio IE/IB of electron injection from the emitter region into the base region, (IE), to the hole injection from the base region into the emitter region (IB). Thus, the graphene base transistor will have a high current gain over most current levels of operation. It will be necessary to supply base current to the graphene base transistor to supply leakage current and recombination current, however, at sufficiently high emitter current, the emitter current should be much larger than the base current and thus have high current gain.

Transistor with high current gain can also be described as having voltage mode operation. Voltage mode operation is desirable in many cases since the transistor base current for switching and modulation is determined by the need for capacitive charging rather than the need to inject current from the base region into the emitter region to change the potential offset of the emitter region to the base region to change the amount of electrons injected from the emitter region into the base region.

There are multiple growth techniques of forming P-type graphene material layers. Graphene sheets that are grown on the carbon face of SiC are often P-type. Graphene grown by CVD on a copper film are also doped P-type.

Operation for N-type Base Graphene Material Layer

For the case of hot electron graphene devices, transistor operation can be obtained for N-type base graphene material layer. It can be desirable that appropriate insulating tunnel barrier or P-type delta doped regions be incorporated in the emitter transition region and the collector transition region to allow appropriate biasing of the emitter region relative to base region and also appropriate biasing of the collector region relative to the base region.

The presence of the insulating tunnel barrier or P-type delta doped region for example allow a electrons to be injected over a potential barrier or through a insulating tunnel barrier into the base graphene material layer as hot electrons without a significant current flow from the base region into the emitter region. Emitter region material can be selected so that there is a valance band offset between the emitter region material and the valance band of the base graphene material layer. For the case of a valance band offset, there will not be direct tunneling from the base graphene material layer into the valance band of the emitter region material.

For a sufficiently high potential barrier at the base region to collector region interface, it may not be necessary to have an insulating tunnel barrier or P-type delta doped material layer in the collector transition region. For operation, it is necessary that a positive bias be applied to the collector region relative to the base region. For a sufficiently high potential barrier between the conduction band minimum in the base region and the conduction band minimum in the collector region at the base region to collector region interface, there will not be parasitic current flow form the base region into the collector region which is desirable for device operation.

High Temperature Operation

The bandgap of the base graphene material layer, if any, will have little variation with temperature. For emitter region material with sufficiently large valance band offset, there will continue to be the mode of operation with essentially no hole injection from the base graphene material layer into the emitter region. For sufficiently wide band material, there will be only small component of band-to-band leakage current in the emitter.

However, with higher temperature of operation, the leakage current and generation current at the emitter region/base region interface, at the base region/collector region interface and on the surface of the graphene in the base access region will increase and additional base current is needed to accommodate the increased leakage current.

Thus, it will be possible for the graphene base transistor to operate at high temperature if the defects at the emitter region/base region interface and base region/collector region interface are minimized or passivated.

An approach for small base-emitter lateral separation using T-emitter metal.

Examples of Embodiments of Hot Electron Graphene Base Transistors

Approach for Small Base-Emitter Lateral Separation Using T-Gate Metal

12. Form emitter in first region on base graphene material layer.
13. Use combination of lithography and metal evaporation to form a T-emitter metal on top surface of emitter.
14. Optionally form dielectric on emitter sidewall.
15. Photostep to define region for base metal.
16. E-beam evaporated base metal that is self-aligned to the T-gate metal.

Hot Electron Embodiment 1—SiC Collector-Base Graphene Material Layer—SMHEI

SMHEI—Semiconductor Material for Hot Electron Injection include InGaN, InAsP, InP, InGaAs, InAlAs, InGaSb, Diamond, GaN, GaAs, silicon, SiC, GaSb, Germanium, AlP, ZnS, GaP, AlSb, AlAs, InGaN, and AlN.

An advantage of using SiC for the collector region is that is that epitaxial graphene sheets can be grown on SiC by sublimation of silicon from the surface of the SiC. Thus, for this embodiment of the graphene base transistor, there is no need to transfer and bond graphene sheet or sheets to the surface of the collector region material. It is well known how to form graphene sheets on the surface of a SiC substrate to those skilled in the art.

For example, epitaxial graphene sheets can be formed on SiC by heating a SiC substrate to approximately 1550 C in argon ambient. The silicon atoms on the surface of the SiC sublimate forming a sheet or sheets of graphene on the surface of SiC.

It is preferable that an N-type doped epitaxial layer of SiC be first grown on a N+ SiC substrate (for backside collector contact) or alternately, an N-type doped SiC epitaxial layer is first grown on a SiC semi-insulating substrate (for topside collector contact).

The preferred off cut orientation for the growth of SiC epitaxial layers on SiC is in the range of zero degrees to eight degrees.

A base graphene material layer is next grown on the surface of the N-type epitaxial SiC layer using the sublimation epitaxial growth techniques described above. The base graphene material layer that is grown on the silicon face of SiC face is typically one to two graphene sheets thick. The base graphene material layer that is grown on the carbon face of SiC is typically approximately 30 graphene sheets thick.

Thus, the base resistance will be lower for the base graphene material layer grown on the carbon face of SiC compared to the graphene material layer that grown on the silicon face of SiC.

Polycrystalline Silicon, Highly Oriented Silicon, or Epitaxial Silicon Emitter Region Material The polysilicon layer is typically deposited by CVD or MBE techniques. The polysilicon layer can be entirely N+ doped, or consist of a layered structure of a thin p-type polysilicon thermionic barrier deposited on the base graphene material layer and an N+ polysilicon deposited on the P+ polysilicon layer to function as the source for electrons for injection of hot electrons into the base layer of the graphene. The defects in the polysilicon layer can be passivated by diffusing hydrogen or fluorine into the polysilicon material as known by those skilled in the art.

To facilitate electrical contact to the base graphene material layer, the polycrystalline silicon material layer can be selectively grown so that after selective growth and oxide etching, the graphene in the base access region is exposed. Alternately, to facilitate electrical contact to the base graphene material layer, base graphene material layer contact can be formed with approximately vertical sidewalls, dielectric spacer formed on the sides of the graphene base material layer contact using RIE, and the emitter region material layer deposited as known by those skilled in the art.

SMHEI Emitter Region Materials

The Semiconductor Material for Hot Electron Injection (SMHEI) emitter region material and the optional emitter transition region material can be formed on the surface of the base graphene material layer by epitaxial growth or alternately, by the deposition of polycrystalline, highly oriented, or amorphous SMHEI.

The SMHEI can consist of layered structure of more than one type of semiconductor material or a semiconductor material with a different ratio of components of the elements of the semiconductor material or with different doping types and concentrations.

The preferred approach is to epitaxially grow a single crystal, highly oriented film, a polycrystalline film or an amorphous film of SMHEI on the surface base graphene material layer.

It is preferred that the SMHEI be doped N-type however, there can be a thin P-type doped SMHEI in the emitter transition region adjacent to the graphene base material layer to implement a thermionic barrier to assist the injection of hot electrons into the base graphene material layer. The SMHEI is ideally grown in a manner to best accommodate the lattice mismatch to the base graphene material layer and minimize defects at the interface between the semiconductor material and the base graphene material layer. Annealing in hydrogen can be performed to passivate the defects in the SMHEI and at the interface of the SMHEI and the graphene material layer.

The emitter transition region can include semiconductor tunnel barrier layer such as made with SMHEI or an insulator tunnel barrier such as made with BN layer to facilitate the injection of hot electrons in the base graphene material layer. The emitter transition region can also include P-type delta doped region in the SMHEI to form a thermionic barrier that assist the injection of hot electrons into the base graphene material layer. The emitter transition region can be designed so that band bending due to surface states and fixed charge at the SMHEI/grapheneinterface form a thermionic barrier that assist the injection of hot electrons in the base graphene material layer.

The transistor of the present invention can also be formed with a mesa structure so that each of the collector, emitter and base regions can be independently contacted. Alternately, to facilitate electrical contact to the base graphene material layer, the SMHEI layer can be selectively grown so that after selective growth and oxide etching, the graphene in the base access region is exposed.

Alternately, to facilitate electrical contact to the base graphene material layer, base graphene material layer contact can be formed with approximately vertical sidewalls, dielectric spacer formed on the sides of the graphene base material layer contact using RIE, and the emitter region material layer deposited as known by those skilled in the art.

To reduce surface recombination which can be detrimental to device performance, a passivation layer can be provided over exposed portions of the collector, emitter and base regions of the transistor.

The emitter region material may be formed by wafer bonding SMHEI to the surface of base graphene material layer. The approaches include direct bonding of the SMHEI to the surface of the base graphene material layer.

For example, the SMHEI can be grown on a silicon substrate and after bonding to the surface of the graphene material layer, the silicon substrate is etched away leaving the thin SMHEI bonded to the surface of the base graphene material layer.

An alternate approach is to use a Smart Cut approach of implanting hydrogen or helium to a depth within the thin SMHEI or into the silicon region beneath the thin SMHEI. A heating operation then causes the hydrogen and or helium to expand, and split off the thick portion of the layer material as known to those skilled in the art. The remaining portion of the thick layered material can then be etched to the thin semiconductor.

Metal or Semiconductor Tunnel Insulator Emitter Region Materials

The emitter region and emitter transition region can be implemented by an insulator tunnel barrier and a metal material for injections. The insulator tunnel barrier can be implemented with materials such as Al2O3, BN, HfO2, graphene, fluorinated graphene, doped graphene insulator, silicon nitride, silicon oxide, AlN, MgO, layered combinations of insulating materials, and other insulator materials knows to those skilled in the art.

The insulator tunnel barrier material may be grown by atomic layer deposition, atomic layer epitaxy, CVD, PECVD, sputtering, ion beam deposition, and other techniques known to those skilled in the art. A metal layer in the emitter region or N+ doped semiconductor or N+ doped semimetal can by the source of electrons that tunnel through the tunnel barrier and are injected into the base region as hot electrons.

Hot Electron Embodiment 2—Base Graphene Material Layer Transferred and Bonded to Semiconductor Collector Region Material The approach to implement this embodiment is the same as described in Hot Electron Embodiment 1 except that the base graphene material layer is implemented by transferring and bonding graphene sheet or sheets to the surface of a semiconductor collector region material.

The graphene material sheets that will be used for the transfer process can be formed on a SiC substrate, a copper substrate, a nickel substrate and other substrates as known to those skilled in the art.

Graphene sheet or sheets can also be transferred to the surface of the semiconductor based collector region material from graphene formed in solution.

It is desirable that the semiconductor collector region material and substrate material be temperature compatible with the SMHEI material growth process and it is also desirable that the semiconductor collector region material and substrate material have a similar thermal expansion coefficient as the SMHEI.

Examples of candidate device structure consist of InGaN, InAsP, InP, InGaAs, InAlAs, InGaSb, Diamond, GaN, GaAs, Silicon, 4H-SiC, GaSb, Germanium, AlP, ZnS, GaP, AlSb, AlAs, or InAlN, AlN and other semiconductor collector region material, a base region consisting of a base graphene layer and an emitter region consisting of SMHEI semiconductor material with optimized emitter transition region and optimized collector transition region.

"Non-Hot Electron Base Transport" Embodiment 3—Base Graphene Material Layer Transferred and Bonded to Semiconductor Collector Region Material The approach to implement this embodiment is the same as described in Hot Electron Embodiment 1 except that the base graphene material layer is implemented by transferring and bonding graphene sheet or sheets to the surface of a semiconductor collector region material and emitter region semiconductor material and collector region semiconductor material are selected so that the electrons are not injected into the base graphene layer as hot electrons.

Candidate semiconductor material for the emitter region are the Semiconductor Material for Non-Hot Electron Injection (SMNHEI) described above. Candidate semiconductor material for the collector region are the Semiconductor Material for Non-Hot Electron Collection (SMNHEC) described above.

The graphene material sheets that will be used for the transfer process can be formed on a SiC substrate, a copper substrate, a nickel substrate and other substrates known as known to those skilled in the art. Graphene sheet or sheets can also be transferred to the surface of the semiconductor based collector region material from graphene formed in solution.

It is desirable that the SMNHEI semiconductor material growth process and anneal process be temperature compatible and have a similar thermal expansion coefficient with the SMNHEC material and the substrate material.

Examples of candidate device structure consist of SMNHEC or other semiconductor collector region material, a base region consisting of a base graphene layer and an emitter region consisting of SMNHEI semiconductor material with optimized emitter transition region and optimized collector transition region.

One of the primary advantages of graphene is that it has extremely high electric conductivity for extremely thin base graphene material layer.

One of the critical parameters for transistors is the base resistance and thus, graphene can have a low base resistance even for very thin base graphene material layers.

A low base resistance is important to achieve a high maximum frequency of oscillation, fmax.

The high electrical conductivity of graphene allows the use of thin base graphene material layer which reduces the transit time of electrons through the base region and also reduces the energy loss of hot electrons in transiting the thin graphene base material.

Some sources indicate that graphene has the potential to have the highest conductivity of any material and can have a higher conductivity than silver. Experimental results indicate that the resistivity of a single sheet of graphene approximately 3 angstrom thick grown on the silicon face of SiC has a sheet resistance on the order of 750 ohm/square to 1000 ohms/square.

Experimental results also indicate that a graphene sheet grown on the surface of copper can have a sheet resistance of approximately 1200 to 1500 ohms/square.

The sheet resistance of few sheets of graphene can be less than 100 ohms/square. The thickness of a few sheets of graphene can be less than 2 nm.

In addition, the high velocity of electrons in the graphene material can lower the base transit time. Thus, the semiconductor device with base graphene material layer can have high fT and high fmax.

The use of graphene for base layer of a transistor can allow high performance AlGaN, GaN, InAlN, and SiC transistors. AlGaN, GaN, InAlN and SiC have extremely high Johnson figure of merit and thus the graphene base transistor can allow high power, high frequency operation.

The use of graphene for base layer of a transistor can allow high performance AlGaN, GaN, InAlN, and SiC transistors. Because of the wide bandgap nature of AlGaN, GaN, InAlN and GaN, the graphene base transistor can allow high temperature operation.

The enhanced lateral thermal conductivity of graphene can spread the thermal load to a larger area and thus reduce the thermal resistance.

The use of graphene for the base region also can lower the transistor turn-on voltage thereby reducing power dissipation within the device.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been illustrated and/or described with respect to only one of several implementations, such feature may be combined with one or more other features of the other implementations as may be desired and advantageous for any given or particular application. Also, to the extent that the terms "including," "includes," "having," "has," "with," or variants thereof are used in the detailed description and/or in the claims, such terms are intended to be inclusive in a manner similar to the term "comprising."

What we claim is:

1. A product of a process of making a graphene base transistor with reduced collector area comprising:
    forming a graphene material layer with a right and left lateral side portion over the top of a third region right and left side material;
    forming a collector material on a substrate;
    depositing a dielectric in the third region right and left side material;
    planarizing the dielectric in the third region right and left side material;
    cleaning and removing the native oxide on the top surface of the collector material;
    transferring a base graphene material layer to the top surface of the graphene material layer;
    bonding the base graphene material layer; and
    photostepping and defining a second graphene material layer to the top surface of the graphene material layer.

2. The product of the process of making a graphene base transistor with reduced collector area of claim 1 wherein the graphene is doped and wherein said doping increases the graphene to semiconductor heterojunction harrier height and lowers the base resistance.

3. The product of the process of making a graphene base transistor with reduced collector area of claim 2 further comprising the step of:
    depositing a material protection layer on the surface of the collector material.

* * * * *